(12) United States Patent
Chang et al.

(10) Patent No.: US 9,496,883 B1
(45) Date of Patent: Nov. 15, 2016

(54) CHIP AND CALIBRATION METHOD THEREOF

(71) Applicant: Realtek Semiconductor Corporation, Hsinchu (TW)

(72) Inventors: Li-Chung Chang, Hsinchu (TW); Chi-Hsuan Kuan, Nantou County (TW)

(73) Assignee: Realtek Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/158,602

(22) Filed: May 19, 2016

(30) Foreign Application Priority Data

Sep. 24, 2015 (TW) .............................. 104131616 A

(51) Int. Cl.
*H03M 1/10* (2006.01)
*H03M 1/00* (2006.01)
*H03M 1/12* (2006.01)

(52) U.S. Cl.
CPC ......... *H03M 1/1009* (2013.01); *H03M 1/1071* (2013.01); *H03M 1/00* (2013.01); *H03M 1/12* (2013.01)

(58) Field of Classification Search
CPC .................................. H03M 1/12; H03M 1/00

USPC .......................... 341/120, 118, 155, 156, 110
See application file for complete search history.

(56) References Cited

U.S. PATENT DOCUMENTS

2010/0213374 A1* 8/2010 Meinel ...................... G01J 5/12
250/338.4

* cited by examiner

*Primary Examiner* — Joseph Lauture
(74) *Attorney, Agent, or Firm* — CKC & Partners Co., Ltd.

(57) ABSTRACT

A calibration method includes generating, by a digital-to-analog converter of a chip, a first predetermined voltage and a second predetermined voltage and outputting the same to an analog-to-digital-converter of the chip to generate a first digital code difference; determining a variation parameter according to the first digital code difference and one of a plurality of second digital code differences stored in a look up table of a memory unit of the chip; driving, by an external testing system, the digital-to-analog converter to generate the first predetermined voltage and the second predetermined voltage and output the same to the analog-to-digital-converter to generate a target code difference; and multiplying the second digital code differences with the variation parameter to calibrate a gain of the analog-to-digital converter according to the target code difference.

20 Claims, 3 Drawing Sheets

CHIP AND CALIBRATION METHOD THEREOF

This application claims priority to Taiwan Application Serial Number, 104131616, filed Sep. 24, 2015, which is herein incorporated by reference.

BACKGROUND

Technical Field

The present disclosure relates to a chip. More particularly, the present disclosure relates to a chip having an analog-to-digital converter and a calibration method thereof.

Description of Related Art

Chips having analog-to-digital converters (ADC) are commonly utilized in various image applications to convert data signals, from an external video source, to digital data for digital processing implemented by subsequent image processing circuits.

Different application environments of the chip or process variations introduced during manufacture bring a negative impact on the voltage range which could be resolved by an ADC or on the resolution of the ADC. For example, the resolved image may have a color cast, an insufficient brightness, etc.

In some approaches, before the chips are utilized, testing signals are directly input to the chips for performing a recursive test to continuously calibrate the analog-to-digital converter until the ADC meets the required specification. However, such an approach requires a large amount of testing time and human resources, as well as a specific testing signal source, which results in a low efficiency.

SUMMARY

An aspect of the present disclosure is to provide a chip. The chip includes an analog-to-digital converter, a memory unit and a digital-to-analog converter. The memory unit is configured to store a look up table. The look up table stores first digital code differences and is calibrated according to a variation parameter. The first digital code differences are generated, according to a first predetermined voltage and a second predetermined voltage, by the analog-to-digital converter at a plurality of gains respectively. The digital-to-analog converter generates the first predetermined voltage and the second predetermined voltage and output the same to the analog-to-digital converter to measure a second digital code difference generated by the analog-to-digital converter at a first gain of the gains. The variation parameter is a ratio of the second digital code difference and one of the first digital code differences.

Another aspect of the present disclosure is to provide a calibration method. The calibration method includes generating, by a digital-to-analog converter of a chip, a first predetermined voltage and a second predetermined voltage and outputting the same to an analog-to-digital-converter of the chip to generate a first digital code difference; determining a variation parameter according to the first digital code difference and one of a plurality of second digital code differences stored in a look up table of a memory unit of the chip; driving, by an external testing system, the digital-to-analog converter to generate the first predetermined voltage and the second predetermined voltage and output the same to the analog-to-digital-converter to generate a target code difference; and multiplying the second digital code differences with the variation parameter, to calibrate a gain of the analog-to-digital converter according to the target code difference.

Yet another aspect of the present disclosure is to provide a chip. The chip includes an analog-to-digital converter, a memory unit, a digital-to-analog converter, and a firmware. The memory unit stores a first digital code difference. The first digital code difference is a digital code difference generated by the analog-to-digital converter according to a first voltage and a second voltage at a gain. The digital-to-analog converter generates the first voltage and the second voltage and output the same to the analog-to-digital converter to measure a second code difference generated by the analog-to-digital converter at the gain. The ratio of the second digital code difference and the first digital code difference is a variation parameter. The firmware calibrates the gain of the analog-to-digital converter according to the variation parameter, and an initial reference voltage and a maximum reference voltage of the analog-to-digital converter.

DETAILED DESCRIPTION

Figure 1:
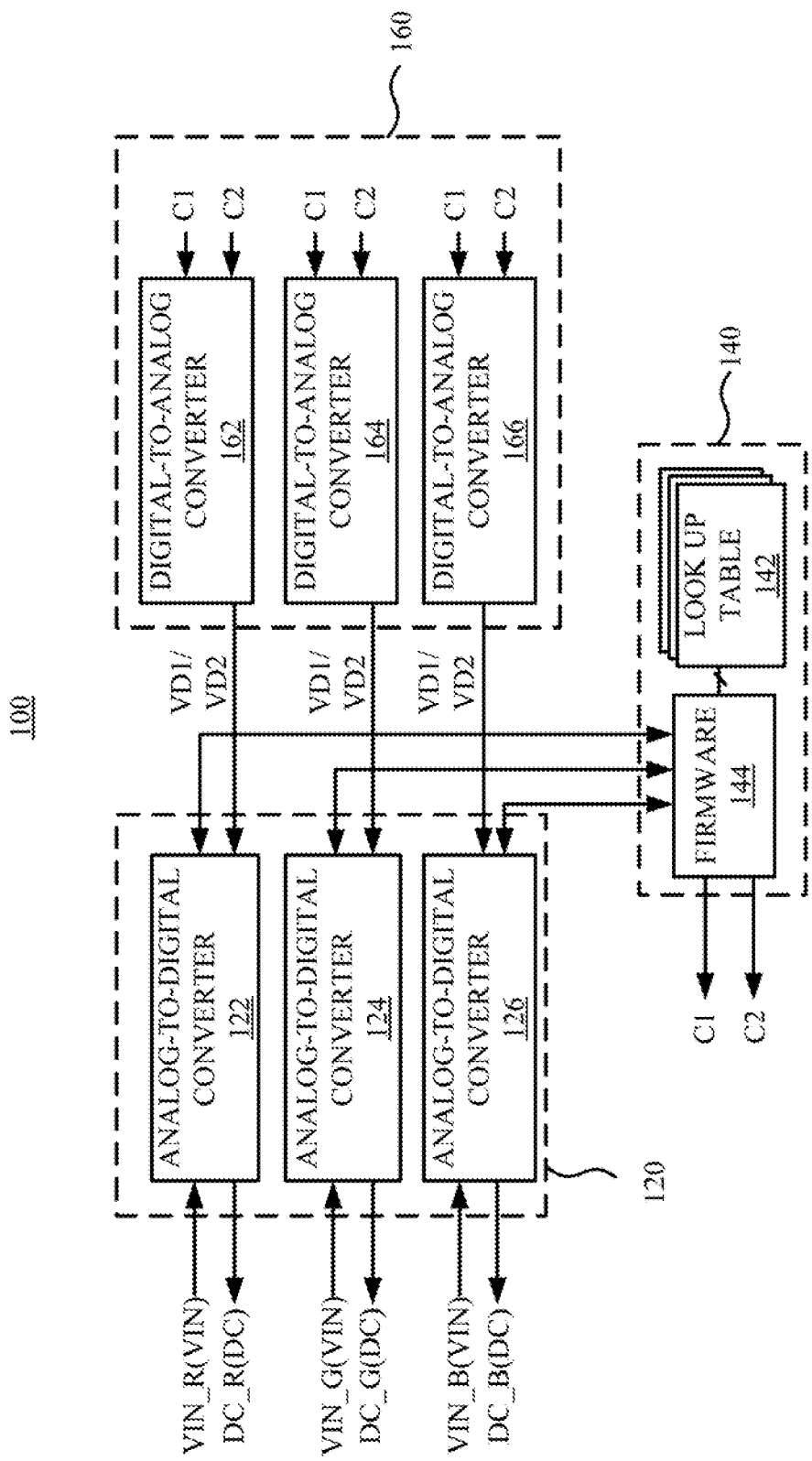
FIG. 1 is a schematic diagram of a chip according to some embodiments of the present disclosure.

FIG. 1 is a schematic diagram of a chip 100 according to some embodiments of the present disclosure. The chip 100 includes an analog-to-digital conversion module 120, a memory unit 140, and a digital-to-analog conversion module 160.

The analog-to-digital conversion module 120 includes analog-to-digital converters (ADCs) 122, 124, and 126. Each of the ADCs 122, 124, and 126 generates a corresponding digital code DC according to a corresponding data signal VIN, which lets the subsequent circuits perform digital data processing on the digital code DC. For example, when the chip 100 is applied in image processing, the external signal source is an RGB signal source. The ADCs 122, 124, and 126 are able to process a data signal VIN_R corresponding to red, a data signal VIN_G corresponding to green, and a data signal VIN_B corresponding to blue, to generate the digital codes DC_R, DC_G, and DC_B respectively. In other words, in some embodiments, the analog-to-digital conversion module 120 utilizes multi-channel ADCs to process data signals of different colors respectively. Accordingly, subsequent circuits are able to perform operations of image processing based on the digital code DC_R, the digital code DC_G and the digital code DC_B.

In some embodiments, the external signal source may be various types of video signal sources, e.g., Yprpb, or other types of signal sources.

In various embodiments, each of the ADCs 122, 124, and 126 may be an ADC having different types of architectures, such as a flash ADC or a successive approximation ADC.

The memory unit 140 stores look up tables 142 and firmware 144 for controlling the chip 100. In some embodiments, each look up table 142 is configured to store digital code differences DF1 (as shown in table 1 below), in which the digital code differences DF1 are the code differences between digital codes (e.g., H0-H8 i and L0-L8 in table 1). The digital codes H0-H8 and L0-L8 are generated, according to a predetermined voltage VD1 and a predetermined voltage VD2, by the ADCs 122, 124, and 126 at a plurality of different gains respectively. The firmware 144 configures the related parameters of the analog-to-digital conversion module 120 and digital-to-analog conversion module 160, e.g., a gain of the ADC 122, an input signal of the DAC 162, etc. For example, the firmware 144 outputs control codes C1 and C2 to control the digital-to-analog conversion module 160 to output the predetermined voltages VD1 and VD2.

In some embodiments, the memory unit 140 may be a register. In some other embodiments, the look up table is configured to be written once into the memory unit 140. In some embodiments, the memory unit 140 might be a one-time programmable memory.

The digital-to-analog conversion module 160 includes digital-to-analog converters (DACs) 162, 164, and 166. The DACs 162, 164, and 166 generate the predetermined voltages VD1 and VD2 and output the same to each of the ADCs 122, 124, and 126 according to the control codes C1 and C2. Accordingly, the ADCs 122, 124, and 125 are able to generate digital code differences DF2 (not shown) according to the predetermined voltages VD1 and VD2. In some embodiments, the digital code differences DF1 and DF2 are configured to be measured under different environments. As a result, with the digital code differences DF1 and DF2, a variation parameter CR corresponding to an actual operating environment of the chip 100 can be determined. In some embodiments, the variation parameter is configured to be a ratio of the digital code differences DF2 to the digital code differences DF1, which is expressed as CR=DF2/DF1.

In some embodiments, each of the DACs 162, 164, and 166 may be a DAC having various different types of architectures, such as a resistor string DAC or a current-steering DAC.

In some embodiments, the look up tables 142 can be calibrated according to the variation parameter CR to eliminate various offsets, e.g., voltage offsets or power variations, introduced from the actual operating environment of the chip 100. As a result, the operational reliability and the accuracy of the chip 100 are able to be improved.

In some embodiments, the number of the ADCs in the analog-to-digital conversion module 120 and the number of the DACs in the digital-to-analog conversion module 160 can be adjusted according the actual applications of the chip 100.

Figure 2:
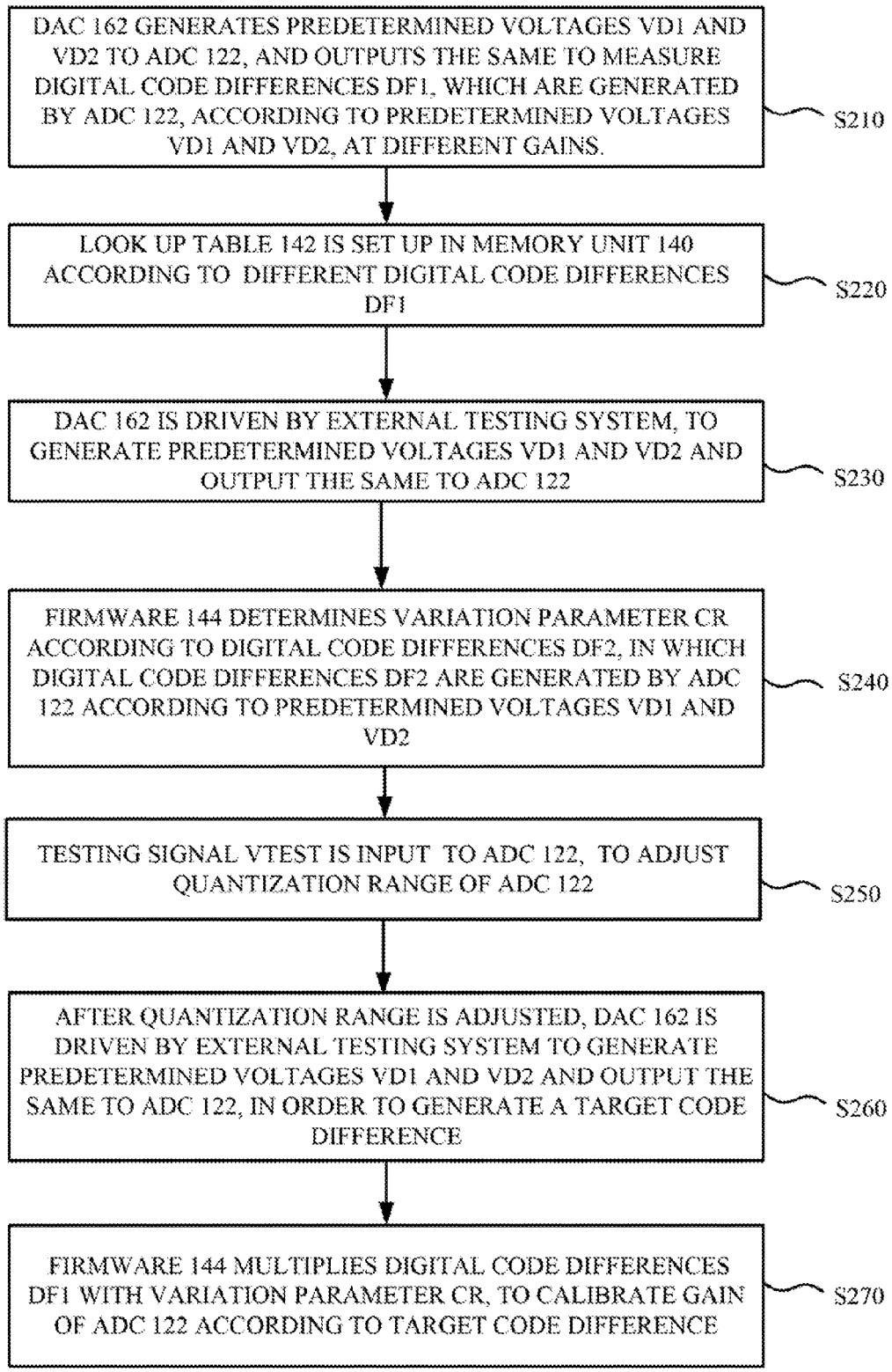
FIG. 2 is a flow chart of a calibration method according to some embodiments of the present disclosure.

Reference is now made to both of FIG. 1 and FIG. 2 to illustrate the operations of the chip 100 and a calibration method 200. For simplicity, the following description is given based on the operations of the ADC 122 and the DAC 162.

In operation S210, the DAC 162 generates the predetermined voltages VD1 and VD2 and outputs the same to the ADC 122 to measure the digital code differences DF1, in which the code differences DF1 are generated, according to the predetermined voltages VD1 and VD2, by the ADC 122 at different gains.

In operation S220, the look up table 142 is set up in the memory unit 140, in which the look up table 142 includes the digital code differences DF1.

Figure 3A:
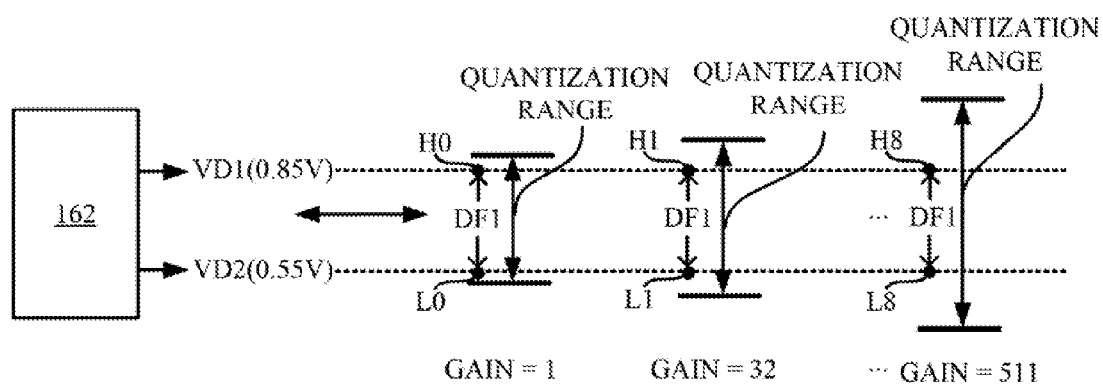
FIG. 3A is a schematic diagram illustrating operations of building a look up table in FIG. 1 according to some embodiments of the present disclosure.
Figure 3B:
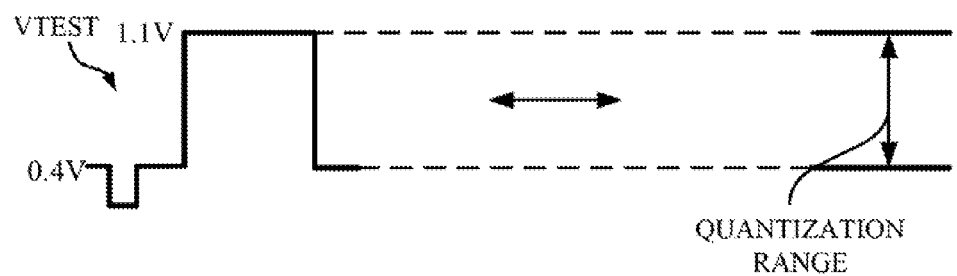
FIG. 3B is a schematic diagram illustrating operations of adjusting a quantization range of an analog-to-digital converter in FIG. 1 according to some embodiments of the present disclosure.

For example, a user A1 is a manufacturer or a developer of the chip 100. In some embodiments, as shown in FIG. 3A, the DAC 162 is driven by a driving voltage, e.g., about 3.3 Volts, provided from a testing tool of the user A1, in order to generate the predetermined voltage VD1 (e.g., about 0.85 Volts) and the predetermined voltage VD2 (e.g., about 0.55 Volts), and output the same to the ADC 122. The testing tool of the user A1 is able to adjust the ADC 122 by the firmware 144 of the chip 100, such that the digital codes H0-H8 and L0-L8 generated, according to the predetermined voltages VD1 and VD2, by the ADC 122 at a plurality of different gains respectively can be measured. The digital code differences DF1 are then able to be determined from the difference between the digital codes H0-H8 and L0-L8. Accordingly, the user A1 can set up the look up table as shown in table 1 according the information above. As shown in FIG. 3A, the higher the gain of the ADC 122, the smaller the digital code differences DF1 in the same voltage range. Effectively, in some embodiments, by adjusting the gain of the ADC 122, a step size of the ADC 122 is adjusted. For example, when the gain is set to be 1, the predetermined voltage VD1 corresponds to a digital code H0 (0x2ff), and the predetermined voltage VD2 corresponds to a digital code L0 (0x000). When the gain is set to be 32, the predetermined voltage VD1 corresponds to a digital code H1 (0x1ff), and the predetermined voltage VD2 corresponds to a digital code L0 (0x200). Such values of the gain and the digital codes above are given for illustrative purposes only, and the present disclosure is not limited thereto.

TABLE 1

| Gain | 1 | 32 | 64 | 128 | 192 |
|---|---|---|---|---|---|
| 0.85 Volts | H0 | H1 | H2 | H3 | H4 |
| 0.55 Volts | L0 | L1 | L2 | L3 | L4 |
| DF1 | H0 – L0 | H1 – L1 | H2 – L2 | H3 – L3 | H4 – L4 |
| Gain | 256 | 352 | 448 | 511 | — |
| 0.85 Volts | H5 | H6 | H7 | H8 | — |
| 0.55 Volts | L5 | L6 | L7 | L8 | — |
| DF1 | H5 – L5 | H6 – L6 | H7 – L7 | H8 – L8 | — |

In some embodiments, the DAC 162 is configured to employ resistors to divide a driving voltage, so as to generate the predetermined voltages VD1 and VD2 according to the driving voltage. By measuring the digital code differences DF1 generated, according to the predetermined voltages VD1 and VD2, by the ADC 122, the voltage offsets introduced from variations in the resistors can be reduced.

Referring back to FIG. 2, in operation S230, a user A2 is able to connect an external testing system with the chip 100, so as to drive the DAC 162 by the external testing system to generate the predetermined voltages VD1 and VD2 and output the same to the ADC 122.

In operation S240, the firmware 144 determines the variation parameter CR according to the digital code differences DF2, in which the digital code differences DF2 are generated by the ADC 122 according to the predetermined voltages VD1 and VD2.

For example, the user A2 may be a hardware developer of the chip 100. The user A2 may be able to dispose the chip 100 on a circuit board, and set the gain of the ADC 122 to a first gain among a plurality of gains. In some embodiments, the first gain is a middle value, e.g., 192 in table 1, of the gains, or any gain within a linear range of the gains, and is sufficient to linearly indicate the relationship between the gains of the ADC 122 and the digital code differences generated by the ADC 122. The DAC 162 is driven to generate the predetermined voltages VD1 and VD2 to the ADC 122, such that the ADC 122 on the circuit board generates the digital code difference DF2 at the first gain. The firmware 144 then divides the digital code difference DF2 by the digital code difference DF1 in table 1 corresponding to the first gain to determine the variation parameter CR.

In operation S250, the user A2 connects the chip 100 to the external testing system, in order to test the quantization range of the ADC 122. For example, the user A2 disposes the chips 100 on circuit boards (e.g., printed circuit boards), and connects them to the external testing system, as shown in FIG. 3A, to input a testing signal VTEST to the ADC 122. The amplitude range of the testing signal VTEST is about 0.4-1.1 volts. In other words, the signal amplitude of the testing signal VTEST is about 0.7 volts. A voltage of 0.4 volts corresponds to the darkest image, and a voltage of 1.1 volts corresponds to the brightest image. The user A2 can adjust the gain of the ADC 122 with the digital code DC generated by the ADC 122 according to the testing signal VTEST, in order to ensure that the quantization range of the ADC 122 can be utilized to analyze the voltage range of 0.4-1.1 volts. In some embodiments, after the quantization range of the ADC 122 is calibrated, the minimum digital code outputted by the ADC 122 corresponds to 0.4 volts, and the maximum digital code outputted by the ADC 122 corresponds to 1.1 volts.

In some embodiments, the quantization range of the ADC 122 is adjusted by adjusting at least one internal reference voltage of the ADC 122, or by adjusting a minimum step size (alternatively referred to as least significant bit, LSB) that is able to be resolved by the ADC 122.

In operation S260, after the quantization range is adjusted, the DAC 162 is driven by the external testing system to generate the predetermined voltages VD1 and VD2 and output the same to the ADC 122, in order to generate a target code difference.

In operation S270, the firmware 144 multiplies the digital code differences DF1 with the variation parameter CR to calibrate the gain of the ADC 122 according to the target code differences.

For illustration, similar to the operations illustrated in FIG. 3A, after the quantization range is adjusted, the gain of the ADC 122 is first fixed. The user A2 connects the external testing system to the circuit boards having the chip 100 to generate digital code differences according to the predetermined voltages VD1 and VD2. The user A2 can average such digital code differences to determine the target code difference corresponding to the external testing system, and then update the target code difference to the firmware 144. In some embodiments, cell variations are present in the circuit boards, or offsets are present in the driving voltages generated from different testing tools. By averaging the digital code differences, the various variations are able to be essentially canceled from the target code difference.

Furthermore, the firmware 144 may be configured to perform an interpolation to calibrate the gain of the ADC 122. The firmware 144 reads the digital code differences DF1 from table 1, and then multiplies the digital code differences DF1 with the variation parameter CR. Accordingly, the firmware 144 can further select two digital code differences DF1 from the adjusted digital code differences DF1 according to the target code differences, in order to perform the interpolation according to the gains to calibrate the ADC 122, in which the gains correspond to the two of the adjusted digital code differences DF1.

For example, as shown in table 1, when the firmware 144 determines that the target code difference falls between the digital code differences (H3–L3)*CR and (H4–L4)*CR, the firmware 144 then performs the interpolation in the numerical range of gains 128-192 to determine the gain of the ADC 122.

Alternatively, the firmware 144 multiplies the digital code differences DF1 in table 1 with the variation parameter CR to generate the look up table, which is illustrated as table 2 below, and stores the same in the memory unit 140. Accordingly, the firmware 140 is then able to determine the gain of the ADC 122 according to the look up table, as illustrated in the table 2, and the target code difference.

TABLE 2

| Gain | 1 | 32 | 64 | 128 | 192 |
|---|---|---|---|---|---|
| DF2 | (H0 − L0) × CR | (H1 − L1) × CR | (H2 − L2) × CR | (H3 − L3) × CR | (H4 − L4) × CR |
| Gain | 256 | 352 | 448 | 511 | — |
| DF2 | (H5 − L5) × CR | (H6 − L6) × CR | (H7 − L7) × CR | (H8 − L8) × CR | — |

With such an arrangement, the chip 100 is able to self-calibrate the ADC 122 according to the predetermined voltages VD1 and VD2 generated by the internal DAC 162 without performing the operations 8210 and S220 again. Accordingly, savings are realized with respect to the time and cost for testing the chip 100.

In some other embodiments, the firmware 144 is configured to store an initial reference voltage VREF0 and a maximum reference voltage VREFT, and calibrate the gain of the ADC 122 according the variation parameter CR, the initial reference voltage VREF0, and the maximum reference voltage VREFT.

For example, compared with the embodiments of storing the digital code differences DF1 and DF2, in this embodiment, the firmware 144 stores the calibration flow corresponding to the equations (1) and (2) below:

$$\text{TARGET} = \frac{(VD1 - VD2)}{VREF \times AF} \times \text{BITS} \quad (1)$$

$$VREF = VREF0 + \frac{GAIN \times VREFT}{GAINT} \quad (2)$$

where TARGET is the target code difference, VD1 and VD2 are the predetermined voltages, VREF is an internal reference voltage of the ADC 122, AF is an attenuation factor for the ADC 122 transmitting signals, BITS is an effective number of bits of the ADC 122, VREF0 is the initial reference voltage of the reference voltage VREF, VREFT is the maximum reference voltage of the reference voltage VREF, GAIN is the gain of the ADC 122, and GAINT is a maximum gain of the ADC 122. In various embodiments, the value of the effective number of bits BITS and the value of the attenuation factor AF are able to be measured in advance, and then set up in the firmware 144.

In this embodiment, the user A1 can set the gain of the ADC 122 as zero and the maximum gain GAINT, in order to determine the initial reference voltage VREF0 and the maximum reference voltage VREFT. The user A1 then updates the aforementioned parameters, which includes, for example, the maximum gain GAINT, the initial reference voltage VREF0, and the maximum reference voltage VREFT, to the firmware 144. After the variation parameter CR is determined (i.e., after the operation S240 is performed), the user A2 can input a first target code difference to the firmware 144. The firmware 144 divides the first target code difference by the variation parameter CR to obtain a second target code difference. The firmware 144 then substitutes the second target code difference into the equation (1) to obtain the corresponding reference voltage VREF. Furthermore, the firmware 144 substitutes the corresponding reference voltage VREF into the equation (2) to determine the calibrated gain GAIN.

In some embodiments, the external testing system includes a mode generator, a logic analyzer, and/or other suitable measurement equipment.

The embodiments illustrated with an image application above are only for illustrative purposes only. Various applications that are able to be applied with the chip 100 can also be calibrated by using the calibration method 200.

As described above, the chip and the calibration method provided in the present disclosure can be self-calibrated via the internal DAC, such that the time for testing the chip and human resource costs associated therewith can be reduced.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A chip, comprising:
   an analog-to-digital converter;
   a memory unit configured to store a look up table, wherein the look up table is configured to store a plurality of first digital code differences, and is configured to be calibrated according to a variation parameter, wherein the first digital code differences are generated, according to a first predetermined voltage and a second predetermined voltage, by the analog-to-digital converter at a plurality of gains respectively; and
   a digital-to-analog converter configured to generate the first predetermined voltage and the second predetermined voltage and output the same to the analog-to-digital converter to measure a second digital code difference generated by the analog-to-digital converter at a first gain among the plurality of the gains;
   wherein the variation parameter is a ratio of the second digital code difference and one of the first digital code differences.

2. The chip of claim 1, wherein the analog-to-digital converter is further configured to have the first gain, and the digital-to-analog converter is configured to be driven by an external testing system to generate the first predetermined voltage and the second predetermined voltage and output the same to the analog-to-digital converter for measuring the second digital code difference of the analog-to-digital converter, and the one of the first digital code differences corresponds to the first gain.

3. The chip of claim 1, wherein the analog-to-digital converter is further configured to receive a testing signal from an external testing system to adjust a quantization range of the analog-to-digital converter;
wherein after the quantization range is adjusted, the digital-to-analog converter is further driven by the external testing system to generate the first predetermined voltage and the second predetermined voltage and output the same to the analog-to-digital converter, and the analog-to-digital converter is further configured to generate a target code difference corresponding to the external testing system according to the first predetermined voltage and the second predetermined voltage.

4. The chip of claim 3, wherein the memory unit is further configured to store a firmware, and the firmware is configured to multiply the first digital code differences in the look up table with the variation parameter, and to select, according to the target code difference, two of the multiplied first digital code differences for performing an interpolation to calibrate the analog-to-digital converter.

5. The chip of claim 3, wherein the memory unit is further configured to store a firmware, and the firmware is configured to store an initial reference voltage and a maximum reference voltage corresponding to the analog-to-digital converter, and to calibrate the gain of the analog-to-digital converter according to the variation parameter, the initial reference voltage and the maximum reference voltage.

6. The chip of claim 5, wherein the gain of the analog-to-digital converter is set as zero to obtain the initial reference voltage, the gain of the analog-to-digital converter is set as a maximum gain to obtain the maximum reference voltage, and the initial reference voltage and the maximum reference voltage are further updated to the memory unit.

7. The chip of claim 3, wherein the memory unit is further configured to store a firmware, the firmware is further configured to obtain a corresponding reference voltage according to the variation parameter and the target code difference, and calibrate the gain of the analog-to-digital converter according to the corresponding reference voltage.

8. A calibration method, comprising:
   generating, by a digital-to-analog converter of a chip, a first predetermined voltage and a second predetermined voltage and outputting the same to an analog-to-digital-converter of the chip to generate a first digital code difference;
   determining a variation parameter according to the first digital code difference and one of a plurality of second digital code differences stored in a look up table of a memory unit of the chip;
   driving, by an external testing system, the digital-to-analog converter to generate the first predetermined voltage and the second predetermined voltage and output the same to the analog-to-digital-converter to generate a target code difference; and
   multiplying the second digital code differences with the variation parameter to calibrate a gain of the analog-to-digital converter according to the target code difference.

9. The calibration method of claim 8, further comprising:
   inputting the first predetermined voltage and the second predetermined voltage to the analog-to-digital converter for measuring the second digital code differences to set up the look up table;
   wherein the second digital code differences are differences between a first digital code and a second code, and the first digital code and the second code are generated by the analog-to-digital converter according to the first predetermined voltage and the second predetermined voltage, respectively, at different gains.

10. The calibration method of claim 9, wherein the one of the second digital code differences corresponds to a first gain of the gains, the first gain is approximately an average value of the gains, and the operation of generating the first digital code difference further comprises:

setting the gain of the analog-to-digital converter to the first gain.

11. The calibration method of claim 8, wherein the operation of determining the variation parameter comprises:

dividing the first digital code difference by the one of the second digital code differences to obtain the variation parameter.

12. The calibration method of claim 8, wherein the operation of calibrating the gain of the analog-to-digital converter comprises:

selecting two of the multiplied second code digital differences according to the target code difference for performing an interpolation to calibrate the analog-to-digital converter.

13. The calibration method of claim 8, wherein the operation of calibrating the gain of the analog-to-digital converter comprises:

calibrating the gain of the analog-to-digital converter according to the variation parameter, an initial reference voltage and a maximum reference voltage, wherein the initial reference voltage and the maximum reference voltages correspond to the analog-to-digital converter.

14. The calibration method of claim 13, wherein the operation of calibrating the gain of the analog-to-digital converter comprises:

setting the gain of the analog-to-digital converter as zero to obtain the initial reference voltage;

setting the gain of the analog-to-digital converter the gain of the analog-to-digital converter as a maximum gain to obtain the maximum reference voltage; and updating the initial reference voltage and the maximum reference voltage to the memory unit.

15. The calibration method of claim 14, further comprising:

obtaining a corresponding reference voltage according to the variation parameter and the target code difference; and calibrating the gain of the analog-to-digital converter according to the corresponding reference voltage.

16. A chip, comprising:
an analog-to-digital converter;
a memory unit configured to store a first digital code difference, wherein the first digital code difference is a digital code difference generated by the analog-to-digital converter according to a first voltage and a second voltage at a gain;
a digital-to-analog converter configured to generate the first voltage and the second voltage, and to output the same to the analog-to-digital converter to measure a second code difference generated by the analog-to-digital converter at the gain, wherein the ratio of the second digital code difference and the first digital code difference is a variation parameter; and
a firmware configured to calibrate the gain of the analog-to-digital converter according to the variation parameter and an initial reference voltage and a maximum reference voltage of the analog-to-digital converter.

17. The chip of claim 16, wherein the gain of the analog-to-digital converter is set as zero to obtain the initial reference voltage, the gain of the analog-to-digital converter is set as a maximum gain to obtain the maximum reference voltage, and the initial reference voltage and the maximum reference voltage are further updated, by the external testing system, to the memory unit.

18. The chip of claim 16, wherein the gain of the analog-to-digital converter, the initial reference voltage, and the maximum reference voltage are satisfied with the following equation:

$$VREF = VREF0 + \frac{GAIN \times VREFT}{GAINT},$$

where VREF is an internal reference voltage of the analog-to-digital converter, VREF0 is the initial reference voltage, VREFT is the maximum reference voltage, GAIN is the gain of the analog-to-digital converter, and GAINT is the maximum gain.

19. The chip of claim 16, wherein the firmware is further configured to obtain a corresponding reference voltage according to the variation parameter and a target code difference, and calibrate the gain of the analog-to-digital converter according to the corresponding reference voltage.

20. The chip of claim 19, wherein the corresponding reference voltage and the target code difference are satisfied with the following equation:

$$TARGET = \frac{VD1 - VD2}{VREF \times AF} \times BITS,$$

where TARGET is a ratio of the target code difference to the variation parameter, VD1 is the first voltage, VD2 is the second voltage, VREF is an internal reference voltage of the analog-to-digital converter, AF is an attenuation factor of the analog-to-digital converter, and BITS is an effective number of bits of the analog-to-digital converter.

* * * * *